US010255386B2

United States Patent
Martinez Canedo et al.

(10) Patent No.: US 10,255,386 B2
(45) Date of Patent: Apr. 9, 2019

(54) SPACE EXPLORATION WITH QUANTITATIVE PRUNING AND RANKING SYSTEM AND METHOD

(71) Applicant: Siemens Product Lifecycle Management Software Inc., Plano, TX (US)

(72) Inventors: Arquimedes Martinez Canedo, Plainsboro, NJ (US); Jan Richter, Lauf a. d. Pegnitz (DE); Lars Jordan, Poing (DE)

(73) Assignee: Siemens Product Lifecycle Management Software Inc., Plano, TX (US)

(*) Notice: Subject to any disclaimer, the term of this patent is extended or adjusted under 35 U.S.C. 154(b) by 456 days.

(21) Appl. No.: 14/952,279

(22) Filed: Nov. 25, 2015

(65) Prior Publication Data
US 2017/0147719 A1    May 25, 2017

(51) Int. Cl.
G06F 17/50    (2006.01)
G06F 17/11    (2006.01)

(52) U.S. Cl.
CPC ........ G06F 17/5009 (2013.01); G06F 17/11 (2013.01); G06F 17/50 (2013.01)

(58) Field of Classification Search
CPC .................................................. G06F 17/50
(Continued)

(56) References Cited

U.S. PATENT DOCUMENTS 6,182,146 B1 * 1/2001 Graham-Cumming, Jr. ................ H04L 29/12009
370/389
6,202,043 B1 * 3/2001 Devoino ............. G06F 17/5009
700/104

(Continued)

FOREIGN PATENT DOCUMENTS

WO    2014078848 A1    5/2014
WO    2016146169 A1    9/2016

OTHER PUBLICATIONS

Kaushal Shubhank, Srijan: Unified Architecture Specification and Design Space Exploration (Year: 2002).*

(Continued)

*Primary Examiner* — Lechi Truong
(74) *Attorney, Agent, or Firm* — Siemens Corporation

(57) ABSTRACT

A system is provided that facilitates design space exploration with quantitative pruning and ranking. The system may determine a collection of component model solutions corresponding to a functional model with functional model ports for a system to be produced. The component model solutions are comprised of simulated components selected from a component library based at least in part on correspondence between component ports of the simulated components and the functional model ports of the functional model. The system may select a subset of the component model solutions from the collection, which have behaviors determined for each component model solution that are consistent with behaviors determined for the functional model. The system may determine rankings for the component model solutions of the subset relative to each other based on a comparison of behaviors for each component model solution to each other and/or to the behaviors determined for the functional model.

20 Claims, 11 Drawing Sheets

(58) Field of Classification Search
USPC .......................................................... 703/1
See application file for complete search history.

(56) References Cited

U.S. PATENT DOCUMENTS

| | | | |
|---|---|---|---|
| 7,167,817 | B2 | 1/2007 | Mosterman et al. |
| 7,490,032 | B1* | 2/2009 | Koh .................. G06F 17/5009 703/22 |
| 9,690,881 | B2 | 6/2017 | Dewilde et al. |
| 2005/0172245 | A1* | 8/2005 | Anderson ........... G06F 17/5045 716/103 |
| 2007/0245294 | A1* | 10/2007 | Saito .................. G06F 17/5045 717/100 |
| 2013/0019216 | A1 | 1/2013 | Vasudevan et al. |
| 2013/0119916 | A1* | 5/2013 | Wang .................... B25J 9/1664 318/600 |

OTHER PUBLICATIONS

Li Lu et al.: "Pruning Strategies in Adaptive Off-line Tuning for Optimized Composition of Components on Heterogeneous System"; International Conference on Parallel Processing Workshop; Proceedings, IEEE; US; pp. 255-264; XP032775862, ISSN: 1530-2016, DOI: 10.1109/ICPPW.2014.42 / Sep. 9, 2014.

Canedo et al.; "Extraction of System Functions from 1-D Simulation Component Libraries"; 2014.

Richter et al.; "Systems-Driven Engineering of Complex Systems: Behavioral Read Modeling"; 2014.

Pohl et al., "Model-based Engineering of Embedded Systems", 2012, pp. 62-65 and 72-77, Sections: Behavior Requirements Model; 4.32; 5.3; 5.4.

\* cited by examiner

DSE Tree Expansion

DSE Tree Pruning

DSE Tree Ranking

FIG. 5
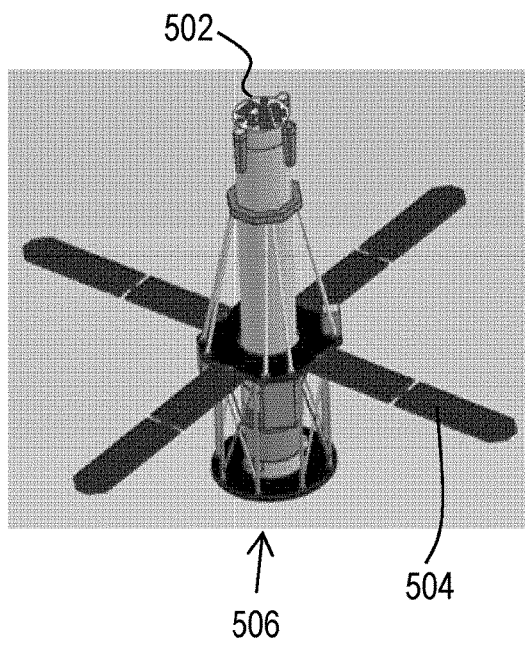
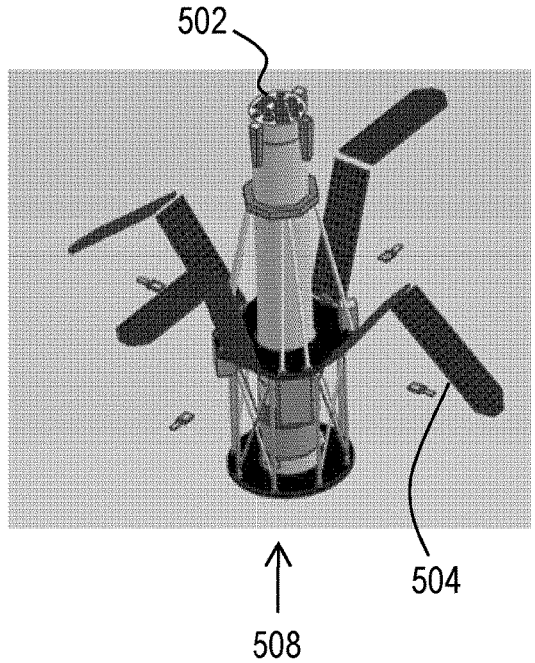

- ▷ Moist Air
- ▷ Electrochemistry Components
- ▷ Fuel Cell
- ▷ Powertrain
- ▷ 3D Mechanical
- ▷ Planar Mechanical
- ▷ Vehicle Dynamics
- ▷ Vehicle Dynamics iCAR
- ▷ Cams and Followers
- ▷ Electro Mechanical
- ▷ Electrical Static Conversion
- ▷ Electrical Basics
- ▷ Electric Motors and Drives
- ▷ Automotive Electrics
- ▷ Engine Signal Generator
- ▷ Electric Storage

FIG. 11

#1 (1102, 1112)
Solution5
- Electric Junctions
  - dynamic_elec_node_76
  - dynamic_elec_node_75
  - dynamic_elec_node_81
  - dynamic_elec_node_80
- Zero Forces
- Signal Sinks
- Batteries
  - drv_battery_72
  - drv_battery_77
- Electric Motors
- Grounds
- Bodies
- Joints
- Temperature Sources
- Constants

#2 (1104, 1114)
Solution1
- Zero Forces
  - zeroforcesource_5
  - zeroforcesource_11
  - zeroforcesource_2
  - zeroforcesource_8
- Joint Drivers
  - torquecon_38
  - torquecon_35
  - torquecon_14
  - torquecon_24
  - torquecon_17
  - torquecon_21
  - torquecon_31
  - torquecon_28
- Grounds
  - zerospeedsource3D_34
  - zerospeedsource3D_20
  - zerospeedsource3D_27
  - zerospeedsource3D_13
- Bodies
  - dynamic_3Dbody_10
  - dynamic_3Dbody_4
  - dynamic_3Dbody_6
  - dynamic_3Dbody_7
  - dynamic_3Dbody_0
  - dynamic_3Dbody_3
  - dynamic_3Dbody_9
  - dynamic_3Dbody_1
- Joints
  - m6dofpilotedpivot_30
  - m6dofpilotedpivot_19
  - m6dofpilotedpivot_23
  - m6dofpilotedpivot_33
  - m6dofpilotedpivot_16
  - m6dofpilotedpivot_26
  - m6dofpilotedpivot_12
  - m6dofpilotedpivot_37
- Constants
  - constant_15
  - constant_19
  - constant_32
  - constant_18
  - constant_22
  - constant_36
  - constant_25
  - constant_29

906 ← → (between #1 and #2)
908 → (at dynamic_3Dbody_9)

#3 (1106, 1116)
Solution2
- Electricity 2 Signal
  - drv_elec2sig120
  - drv_elec2sig137
  - drv_elec2sig179
  - drv_elec2sig162
  - drv_elec2sig128
  - drv_elec2sig171
  - drv_elec2sig154
  - drv_elec2sig145
- Electric Motors
  - drv_electricmotortherm_31
  - drv_electricmotortherm_22
  - drv_electricmotortherm_14
  - drv_electricmotortherm_48
  - drv_electricmotortherm_73
  - drv_electricmotortherm_39
  - drv_electricmotortherm_58
  - drv_electricmotortherm_65
- Electric Grounds
  - drv_pot_ref_19
  - drv_pot_ref_70
  - drv_pot_ref_53
  - drv_pot_ref_61
  - drv_pot_ref_27
  - drv_pot_ref_78
  - drv_pot_ref_36
  - drv_pot_ref_44
- Zero Forces
- Grounds
- Bodies
- Joints
- Temperature Sources
  - th_temperature_source_60
  - th_temperature_source_18
  - th_temperature_source_26
  - th_temperature_source_52
  - th_temperature_source_69
  - th_temperature_source_77
  - th_temperature_source_43
  - th_temperature_source_35
- Constants

#4 (1108, 1118)
Solution4
- Electric Junctions
  - dynamic_elec_node_75
  - dynamic_elec_node_76
- Zero Forces
- Signal Sinks
- Batteries
  - drv_battery_72
- Electric Motors
  - drv_electricmotortherm_59
  - drv_electricmotortherm_36
  - drv_electricmotortherm_21
  - drv_electricmotortherm_14
  - drv_electricmotortherm_44
  - drv_electricmotortherm_51
  - drv_electricmotortherm_29
  - drv_electricmotortherm_66
- Grounds
- Bodies
- Joints
- Temperature Sources
- Constants

#5 (1110, 1120)
Solution3
- Zero Forces
- Signal Sinks
- Batteries
  - drv_battery_17
  - drv_battery_24
  - drv_battery_47
  - drv_battery_54
  - drv_battery_69
  - drv_battery_32
  - drv_battery_62
  - drv_battery_39
- Electric Motors
  - drv_electricmotortherm_59
  - drv_electricmotortherm_36
  - drv_electricmotortherm_21
  - drv_electricmotortherm_14
  - drv_electricmotortherm_44
  - drv_electricmotortherm_51
  - drv_electricmotortherm_29
  - drv_electricmotortherm_66
- Grounds
- Bodies
- Joints
- Temperature Sources
- Constants

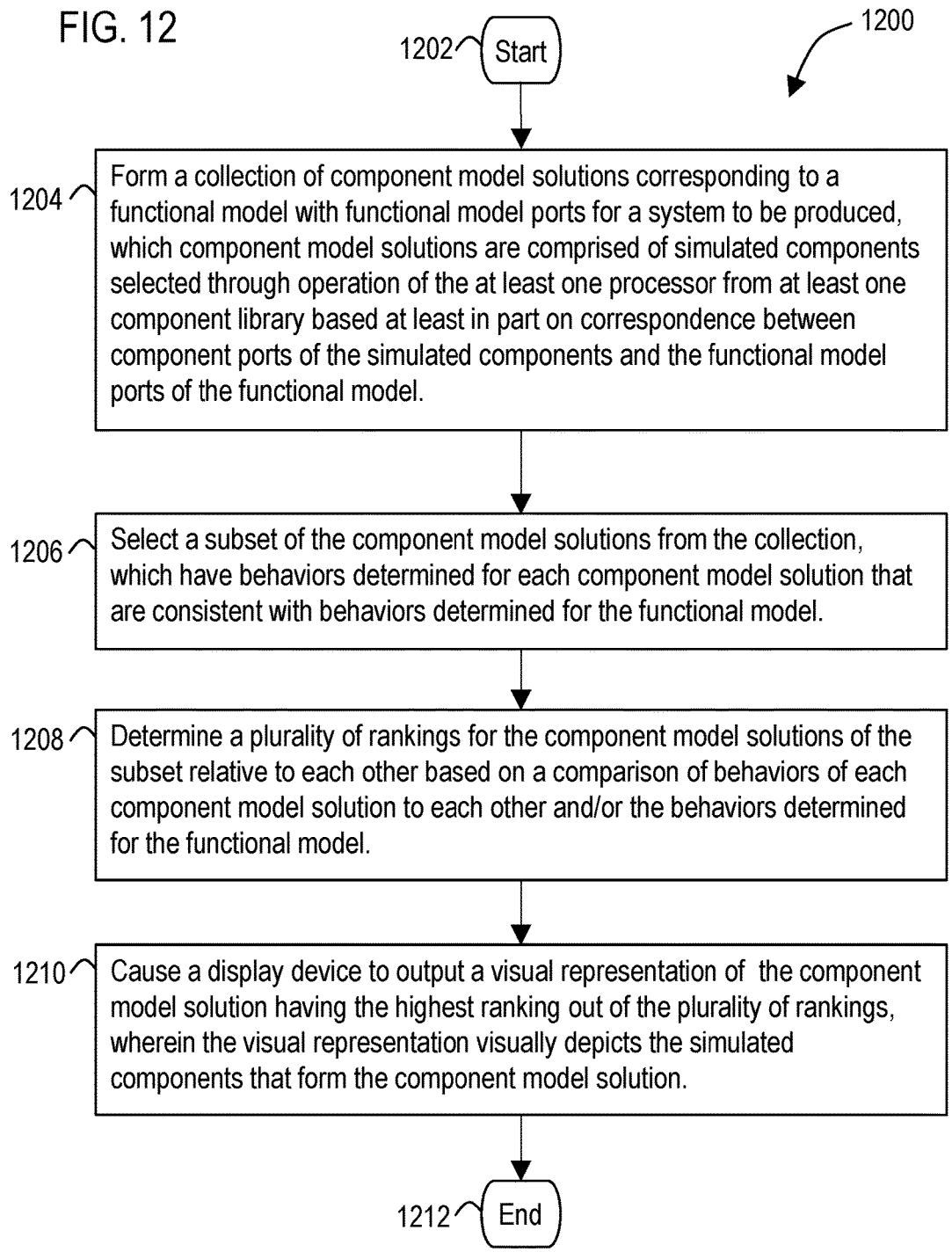

SPACE EXPLORATION WITH QUANTITATIVE PRUNING AND RANKING SYSTEM AND METHOD

TECHNICAL FIELD

The present disclosure is directed, in general, to simulation software for the modeling and analysis of multi-domain systems (e.g., hydraulic, pneumatic, thermal, electric and/or mechanical systems), computer-aided design (CAD), computer-aided engineering (CAE), visualization, and manufacturing systems, product data management (PDM) systems, product lifecycle management (PLM) systems, Application Lifecycle Management systems (ALM), and similar systems, that are used to create, use, and manage data for products and other items (collectively referred to herein as product systems).

BACKGROUND

Product systems may include features that facilitate simulating multi-domain systems. Such product systems may benefit from improvements.

SUMMARY

Variously disclosed embodiments include processing systems and methods that may be used to facilitate generation of component models solutions representing the functional operation of multi-domain systems via design space exploration with quantitative pruning and ranking.

In one example, a processing system may comprise at least one processor. The at least one processor may be configured to determine a collection of component model solutions corresponding to a functional model with functional model ports for a system to be produced. The component model solutions may be comprised of simulated components selected through operation of the at least one processor from at least one component library based at least in part on correspondence between component ports of the simulated components and the functional model ports of the functional model. In addition, the at least one processor may be configured to select a subset of the component model solutions from the collection, which have behaviors determined for each component model solution that are consistent with behaviors determined for the functional model. Also the at least one processor may be configured to determine a plurality of rankings for the component model solutions of the subset relative to each other based on a comparison of behaviors for each component model solution to each other and/or to the behaviors determined for the functional model. Further, the at least one processor may be configured to cause a display device to output a visual representation of the component model solution having the highest ranking out of the plurality of rankings, wherein the visual representation visually depicts the simulated components that form the component model solution.

In another example, a method may include various acts carried out through operation of at least one processor. Such a method may include forming a collection of component model solutions corresponding to a functional model with functional model ports for a system to be produced. The component model solutions may be comprised of simulated components selected through operation of the at least one processor from at least one component library based at least in part on correspondence between component ports of the simulated components and the functional model ports of the functional model. Also, this method may include selecting a subset of the component model solutions from the collection, which have behaviors determined for each component model solution that are consistent with behaviors determined for the functional model. In addition, this method may include determining a plurality of rankings for the component model solutions of the subset relative to each other based on a comparison of behaviors of each component model solution to each other and/or the behaviors determined for the functional model. Further this method may include causing a display device to output a visual representation of the component model solution having the highest ranking out of the plurality of rankings, wherein the visual representation visually depicts the simulated components that form the component model solution.

A further example may include non-transitory computer readable medium encoded with executable instructions (such as a software component on a storage device) that when executed, causes at least one processor to carry out this described method.

The foregoing has outlined rather broadly the technical features of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiments disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the Detailed Description below, it may be advantageous to set forth definitions of certain words or phrases that may be used throughout this patent document. For example, the terms "include" and "comprise," as well as derivatives thereof, mean inclusion without limitation. The singular forms "a", "an" and "the" are intended to include the plural forms as well, unless the context clearly indicates otherwise. Further, the term "and/or" as used herein refers to and encompasses any and all possible combinations of one or more of the associated listed items. The term "or" is inclusive, meaning and/or, unless the context clearly indicates otherwise. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Also, although the terms "first", "second", "third" and so forth may be used herein to describe various elements, functions, or acts, these elements, functions, or acts should not be limited by these terms. Rather these numeral adjectives are used to distinguish different elements, functions or acts from each other. For example, a first element, function, or act could be termed a second element, function, or act, and, similarly, a second element, function, or act could be termed a first element, function, or act, without departing from the scope of the present disclosure.

In addition, phrases such as "processor is configured to" carry out one or more functions or processes, may mean the processor is operatively configured to or operably configured to carry out the functions or processes via software, firmware, and/or wired circuits. For example, a processor that is configured to carry out a function/process may correspond to a processor that is executing the software/ firmware, which is programmed to cause the processor to carry out the function/process and/or may correspond to a processor that has the software/firmware in a memory or storage device that is available to be executed by the processor to carry out the function/process. It should also be noted that a processor that is "configured to" carry out one or more functions or processes, may also correspond to a processor circuit particularly fabricated or "wired" to carry out the functions or processes (e.g., an ASIC or FPGA design). Further the phrase "at least one" before an element (e.g., a processor) that is configured to carry out more than one function may correspond to one or more elements (e.g., processors) that each carry out the functions and may also correspond to two or more of the elements (e.g., processors) that respectively carry out different ones of the one or more different functions.

The term "adjacent to" may mean: that an element is relatively near to but not in contact with a further element; or that the element is in contact with the further portion, unless the context clearly indicates otherwise.

Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

FIG. 5 illustrates an example of a satellite structure with folding/unfolding solar panels.

FIG. 7 illustrates an example of a library of simulated components.

FIG. 11 illustrates a collection of ranked component model solutions.

FIG. 12 illustrates a flow diagram of an example methodology that facilitates generation of ranked component model solutions representing the functional operation of multi-domain systems.

DETAILED DESCRIPTION

Figure 1:
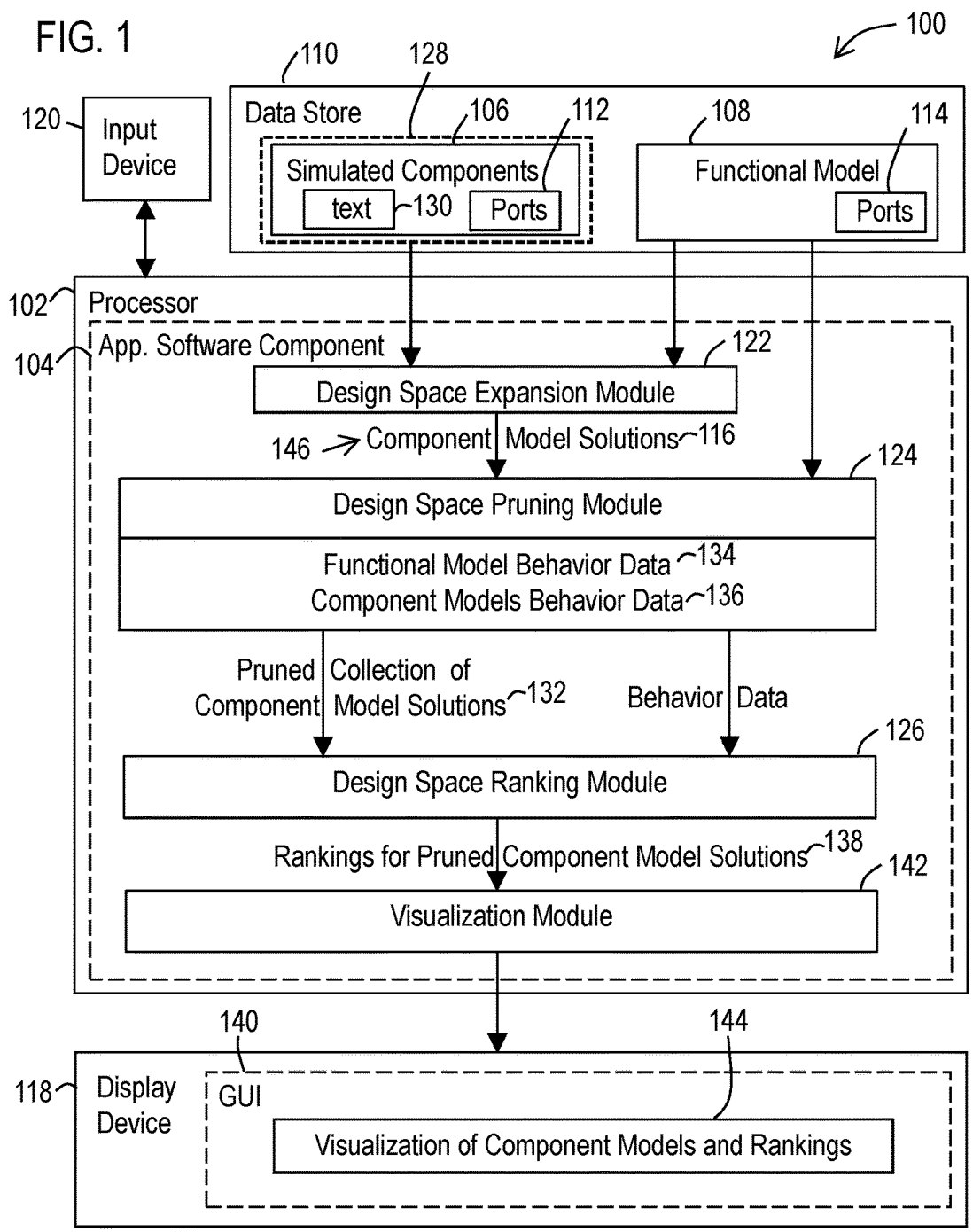
FIG. 1 illustrates a functional block diagram of an example system that facilitates generation of ranked component model solutions representing the functional operation of multi-domain systems.

Various technologies that pertain to systems and methods for generating component models will now be described with reference to the drawings, where like reference numerals represent like elements throughout. The drawings discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged apparatus. It is to be understood that functionality that is described as being carried out by certain system elements may be performed by multiple elements. Similarly, for instance, an element may be configured to perform functionality that is described as being carried out by multiple elements. The numerous innovative teachings of the present application will be described with reference to exemplary non-limiting embodiments.

With reference to FIG. 1, an example processing system 100 is illustrated that facilitates generation of component models solutions. The processing system 100 may include at least one processor 102 that is configured to execute at least one application software component 104 from a memory accessed by the processor. The application software component may be configured (i.e., programmed) to cause the processor to carry out various acts and functions described herein. For example, the described application software component 104 may include and/or correspond to a module of a simulation and analysis tool such as Siemens LMS Imagine.Lab Amesim and/or System Synthesis or any other tool that facilitates the design of simulation models representing the operation of multi-domain systems.

The described application software component 104 may be comprised of one or more software components (also referred to herein as modules) that facilitate generation of several candidate simulations specifying different sets of components (e.g., electrical, mechanical components) for carrying out a functional model design. Such candidate simulations for a particular functional model design are referred to herein as component model solutions.

For example, the described application software component 104 may include a design space expansion module 122, a design space pruning module 124, and a design space ranking module 126, that facilitate the generation, pruning, and ranking of such component module solutions. However, it should be appreciated that the features described herein as being carried out by separate software component/modules may be carried out by fewer software components/modules and/or a single software component/module. Also, features carried out by a single described software component/module may be carried out by two or more software components/modules that communicate with each other.

In an example embodiment, the design space expansion module 122 may be configured to cause the processor 102 to access one or more libraries of simulated components 106 from a data store 110. Such a data store 110 may correspond to one or more of a memory, file system, database, storage device, server, application, or any other component that is operable to store and provide access to simulated components and functional models.

The accessed simulated components 106 may correspond to re-usable software programs that simulate individual physical components associated with fluids, thermodynamics, electrics, electromechanical, mechanics, signal processing, and computers, as well as application libraries for cooling systems, air conditioning, internal combustion engines, aerospace and other physical systems. Examples of simulated components include software programs that simulate the operation of a/an electric motor, resister, transformer, battery, piston, internal combustion engine, heat exchanger, pump, valve, gear, cam, and/or any other physical component having behaviors that can be modeled via software. Such simulated components may also include re-usable software programs that simulate the operation of software components and applications. In addition, in some examples, the simulated components described herein may correspond to re-usable software components that are themselves usable to build one or more portions of a desired system.

The Siemens LMS Imagine Amaesim software/tool, for example, includes a library of thousands of dedicated simulated components that may be accessed by the design space expansion module 122. However, it should be understood that simulated components may be accessed from one or more other simulation software/tools such as MathWorks Simulink, or any other tool that provides a library of simulated components that model the operation of physical components.

Also, it should be appreciated that example embodiments of the design space expansion module 122 may be operative to interrogate known and/or previously unknown libraries of simulated components to determine: the various types of simulated components that are available; the manner in which such simulated components may be connected together; associated behaviors of each simulated component, and/or co-simulation capabilities between simulation/software tools.

In an example embodiment, the simulated components accessed by the design space expansion module 122 may conform to a strongly typed port system. Such a port system may correspond to specific input/output interfaces (called ports) 112 of the components that receive inputs and provide outputs of data representative of the transfer of power or signals associated with the functional operation of the component. Simulation software/tools that provide such strongly typed simulated components (such as Siemens LMS Imagine.Lab Amesim) may enable the designer to connect the input port of one component to the output port of another component to form a simulated multi-component model of a system. When executed by a simulation software/tool, such a component model of the system is capable of providing operational data (i.e., behaviors) consistent with a real-world implementation of such a system.

For example, a simulated component for a motor may include an input port that represents an interface to the component that receives data representative of a flow of electrical energy (EE). Such a simulated motor component may also include an output port that represents an interface that provides data representative of the resulting rotational mechanical energy (RME) provided by the shaft of the simulated motor. In addition, the simulated motor component may include programming, which calculates data representative of the dynamic rotation of the shaft based on the input data representative of the flow of electrical power.

To manually design an example component model depicting a system having such a simulated motor, a simulation software/tool may be used by a designer to manually specify connections between the simulated motor and other simulated components. The resulting component model specifies the set of simulated components and their respective connections with each other. The component model may then be stored in a data store and executed by the simulation tool in order to analyze behaviors of the designed system.

For example, a component model may be designed that specifies that: the electrical energy output port of a simulated battery is connected to the electrical energy input port of the simulated motor; and the rotary output port of the simulated motor is connected to the rotary input port of a simulated pump. Also, it should be noted that the simulation software/tool may be configured to not allow the electrical energy output port of the simulated battery to be connected to the rotor input port of the simulated pump, because the port types are not of the same type.

As used herein, a strongly typed port system corresponds to a library of simulated components in which their respective input and output ports receive and output data in predetermined formats that are consistent across multiple components. Thus, electronic devices such as the simulated motor may include an input port for receiving data representative of electrical energy, while the simulated battery includes an output port for outputting data representative of electrical energy, all of which data has the same predetermined format that describes the relevant electrical characteristics of the electrical energy (e.g., voltage, current) for the component. Examples of strongly typed port formats include: linear ports, rotary ports, rope ports, signal ports, flow ports, electrical ports, thermal ports, magnetic ports, meca2d ports (used to transit 2-d displacements, velocities, accelerations, torque, force), and geocom ports (used to transmit geometric data of evaporators and condensers), or any other type of port that defines data for the input/output of transmitting power or signals.

In example embodiments, the design space expansion module 122 may also be configured to cause the processor 102 to access one or more functional models 108 from the data store 110. Such a functional model corresponds to a model-based systems engineering definition corresponding to a functional block diagram of a desired system. The functional model may represent a behavioral counterpart of a graph of verb-noun functions that describes a family of desired or admissible behaviors.

In example embodiments, the functional model 108 may depict blocks (e.g., via boxes) that define the various functions that the system will carry out, without specifying components. The functional model may also include links (e.g., via lines) between the blocks of the functional model that show connections between input/output ports 114 of the blocks. Such, input/output ports may specify the transmission of power and signals between the functional blocks that make up the functional model.

For example, a functional model 108 may be generated by a designer using a general purpose flow chart tool such as Microsoft Visio or other tool capable of generating blocks (corresponding to functions) and links between boxes (corresponding to the connection of ports conforming to the strict port type system described previously). In addition, a functional model 108 may be generated by a modeling software/tool such as Siemens LMS Imagine.Lab System Synthesis or other tool, which enables a user to graphically draw the functional requirements for a desired system in a manner that conforms to the strict port type system.

In example embodiments, the design space expansion module 122 may be operative to access a functional model previously stored in a data store (e.g., a Microsoft Visio file) and determine from the model, the various functions and connections between ports of the functions that define a desired system. In addition, the described application software component 104 may be operative to access additional data stored in a functional model, such as data that defines constraints and/or desired behaviors for the functional model.

Example embodiments of the design shape expansion module 122 may be configured to take advantage of correspondence between the port types of the functions in the functional model 108 and the port types of the simulated component 106 (available in a library 128) in order to determine simulated components (accessed from the library) that may be capable of carrying out the functions defined in the functional model. In addition, the design shape expansion module 122 may be operative to determine behavior metadata (e.g., textual functional descriptions 130) associated with the simulated components 106 from the component library 128 and/or the components themselves, which are usable to select components capable of fulfilling the functions specified by the functional model 108.

With these simulated components (selected via port type and optional textual description data) and the connections between functions and other data specified by the functional model, the design shape expansion module 122 is operative to carry out a design space expansion in order to determine a collection 146 of different component model solutions 116. Such component model solutions are each comprised of a set of simulated components that are configured (i.e., wired together via their ports) to carry out the functions specified by the functional model 108 for the system to be generated.

It should be noted that the software implementations of the port systems for a library of simulated components 106 may differ from the port system used in the functional model 108, depending on the library of components and functional modeling software that is used in example embodiments. However, as long as the port systems are at least partially isomorphic to each other, an example embodiment of the design shape expansion module 122 may compare each port system to each other and/or determine correlations between corresponding port types between the component library and functional model (e.g., based on key words), in order to select simulated components from a library that are consistent with the functional model.

The following algorithm ("Algorithm 1") describes the expansion of the design space based on the port structure and optional textual functional descriptions carried out by the design shape expansion module 122:

---
Algorithm 1: Design Space Expansion
---
Inputs
  Functional model $M_F$ of desired system with ports from port type set $T_P$
  Library of abstract components $L_C$, where all components adhere to the
    port type set $T_P$, and optionally contain functional information
Outputs
  Collection $C_i$ of component model solutions $M_{Ci} \in C_i$ that conform to
    the port structure imposed by the functional model and with the
    functional model itself
DO
  candidateModelList ← findByPortsAndFunction ($L_C$, $M_F$,
  refinementDepth )
  C ← candidateModelList
END
---

Algorithm 1 returns a collection C 146 of component model solutions $M_{Ci}$ 116 that are consistent with the internal and external port structure of the functional model $M_F$ 108, as well as with determined functional information (if the library components provide metadata such as textual functional descriptions 130). It should be appreciated that this structural and quantitative design space expansion is operative to identify potential architectures; however, at this stage the validation has not yet taken place as to whether each of the candidate component model solutions actually fulfills the functional and non-functional requirements of a desired system.

Figure 2:
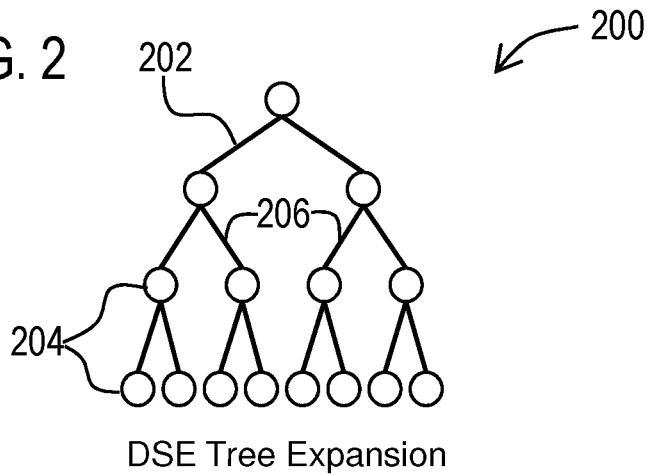
FIG. 2 illustrates an example of a design space expansion visually represented in a tree structure.

FIG. 2 illustrates a schematic example of a design tree expansion 200 depicting the results of Algorithm 1 as a tree structure 202. In this example, the nodes 204 of the tree structure correspond to components and the branches 206 correspond to component model solutions 116.

Referring back to FIG. 1, as discussed previously, the application software component 104 may also include a design space pruning module 124. Such a design space pruning module may be configured to select a subset (i.e., a pruned) collection 132 of the component model solutions 116 (determined by the design space expansion module 122), which have behaviors determined for each component model solution that are consistent (e.g., compatible) with behaviors determined for the functional model 108. In other words, the design space pruning module 124 may be configured to prune out inadequate component model solutions 116. The following algorithm ("Algorithm 2") describes the behavior-based pruning of inadequate generated solutions that may be carried out by the design space pruning module 124:

---
Algorithm 2: Behavioral Design Space Pruning
---
Inputs
  Collection $C_i$ of component model solutions $M_{Ci} \in C_i$ that conform to
    the port structure imposed by the functional model and with the
    functional model itself (output of Algorithm 1)
  Behavioral functional model $\mathcal{B}(M_F)$ describing a family of admissible
  behaviors
Outputs
  Collection $C_o \subseteq C_i$ of component model solutions $M_{Ci} \in C_o$ that are
    behaviorally compatible with behavioral functional model: $\forall M_{Ci} \in$
    $C_o$:$\mathcal{B}(M_{Ci}) \subseteq \mathcal{B}(M_F)$.
INITIALIZE
  $C_o = \emptyset$
FOREACH $M_{Ci} \in C_i$ DO
  IF verifyBehavioralInclusion ($\mathcal{B}(M_{Ci}),\mathcal{B}(M_F)$)
    $C_o \leftarrow M_{Ci}$
  END
END
---

Algorithm 2 may be configured to determine the behaviors $\mathcal{B}(M_{Ci})$ 136 of each component model solution $M_{Ci}$ 116 in the collection $C_i$ 146 and prune out solutions having behaviors that are inconsistent with the behaviors $\mathcal{B}(M_F)$ 134 associated with the functional model $M_F$ 108. The output of Algorithm 2 is a pruned collection $C_o$ 132 of component model solutions.

For example, Algorithm 2 may be configured to determine various behavior data 136, of each component model 116 solution (in the collection 146) that are inherent from the types and descriptions of the simulated components in each component model solution. For example, as will be described in more detail below, the types of simulated components selected may permit only a certain number of degrees of freedom of motion. Thus if the functional model 108 specifies behavior data 134 that requires a minimum number of degrees of freedom of motion, the described design space pruning module 124 may prune out component model solutions that do not meet this required threshold to form the pruned collection 132.

Also for example, Algorithm 2 may execute each component model solution (in the collection 146) in order to quantify the behaviors $\mathcal{B}(M_{Ci})$ of each solution and prune out solutions having behaviors that are inconsistent with any behavior constraints $\mathcal{B}(M_F)$ specified by the functional mode. For example, the functional model may specify desired operational behavior data 134 with respect to minimum or maximum thresholds of efficiency, power, speed, and or any other operational characteristic that is desirable for a system based on the functional model. The described design space pruning module 124 may prune out component model solutions having corresponding operational behavior data 136 (determined via executing and analyzing the component model solutions) that do not meet these required operation thresholds. In this example, the described design space pruning module 124 may be configured to interface with a simulation software/tool (e.g., Amesim, Modelica, or Simulink) and to cause the tool to execute each component model solution and provide such quantifiable operational behavior data 136 regarding the operation of the component model solution.

In addition, some forms of a functional model may include associated mathematical algorithms that define desired behaviors $\mathcal{B}(M_F)$ for a system based on the functional model. In an example embodiment, Algorithm 2 may use such mathematical algorithms to determine component model solutions that are consistent with the functional model. For example, the functional model may include both connected blocks representing desired functionality (adhering to strongly typed port system) as well as a set of algorithmic behaviors (specified via a design tool such as MathWorks Simulink) representative of the desired dynamic (with respect to time) operational behaviors of one or more functions of the functional model. The described design space pruning module 124 may be configured to execute (or cause another tool such as MathWorks Simulink to execute) such algorithmic behavior of the functional model in order to determine quantifiable behavior data 134 that is desired for the functional model.

Also in this example (as discussed previously), the described design space pruning module 124 may be configured to interface with a simulation software/tool (e.g., Amesim, Modelica, or Simulink) to cause the tool to execute each component model solution and provide quantifiable operational behavior data 136 regarding the operation of the component model solution. The quantifiable behavior data of each component model solution may then be compared to the desired determined quantifiable behavior data of the functional model in order to prune out inconsistent component model solutions.

In example embodiments, the example function "verifyBehavioralInclusion" (in Algorithm 2), may be configured to compare the behavior data 136 of each component model solution 116 to the behavior data 134 of the functional model 108 and deliver data usable to prune out inappropriate model solutions. Such data, for example, may correspond to a binary result and can be implemented by several candidate formalisms that depend on the express behaviors $\mathcal{B}(M_F)$ and $\mathcal{B}(M_{Ci})$. In example embodiments, candidate formalisms that may be used to determine/compare behaviors between the component model solutions and the functional model include: Uncertain linear dynamics; Linear or nonlinear ordinary differential equation systems (ODEs) and differential-algebraic equation systems (DAEs); Languages and automata; Petri nets; and/or Propositional and temporal logics. The function "verifyBehavioralInclusion" may also be based on rigorous methods, such as model checking.

Figure 3:
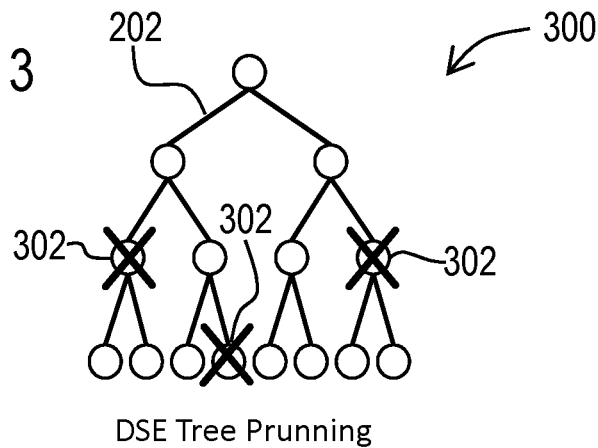
FIG. 3 illustrates an example of a design space expansion tree structure with pruned nodes/branches.

FIG. 3 illustrates a schematic example of a design space pruning 300 depicting the tree structure 202 resulting from Algorithm 1 in which several nodes 302 have been pruned out based on the results from Algorithm 2.

Referring back to FIG. 1, as discussed previously, the application software component 104 may also include the design space ranking module 126. Such a design space ranking module 126 may be configured to determine a plurality of rankings 138 for at least some of the component model solutions of the pruned subset 132 (i.e., the pruned collection) relative to each other based on respective levels of compatibility between the determined behaviors 136 for the respective component model solutions and the determined behavior 134 for the functional model.

The following algorithm ("Algorithm 3") describes the behavior-based ranking that may be carried out by the design space ranking module 126:

---

Algorithm 3: Behavioral Design Space Ranking

---

Inputs
   Collection $C_o$ of component model solutions $M_{Ci} \in C_o$ that are behaviorallycompatible with the behavioral functional model: $\forall M_{Ci} \in C_o : \mathcal{B}(M_{Ci}) \subseteq \mathcal{B}(M_F)$.
Outputs
   Sorted list L of component model solutions that are behaviorally closer to the expected ideal behavior.
INITIALIZE
   L = ∅
FOREACH $M_{Ci} \in C_o$ DO
   $C_r \leftarrow\ <M_{Ci}, \text{CalculateBehavioralScore}(M_{Ci})>$
END
L ← Sort($C_r$)

---

In example embodiments, a byproduct of the behavioral-based pruning (Algorithm 3) may include behavior data 134 that can be used to compare the pruned component model solutions to each other. Based on these comparisons, Algorithm 3 provides a ranking 138 of the identified feasible solutions. Such a ranking may correspond to an ordered list L of the component model solutions, that is ordered by how well each component model solutions corresponds to the desired behavior of the functional model. Such a ranked list of components may be used to identifying the best candidate solutions to use to base the design of a new system. In other embodiments, such a ranking may correspond to scores stored in association with each of the component model solutions.

In example embodiments, comparisons between behavior data 136 for each component model solution and the desired behavior data 134 for the functional model may be calculated as quantitative behavioral scores via L2 gain and/or Root-Mean-Square-Error (RMSE) for example. Thus, in Algorithm 3, the example function "CalculateBehavioralScore" may be configured to return a real value ranking 138 for each of the component model solution (in the pruned collection 132), which real value ranking 138 describes the proximity to the ideal expected behavior. For example, the real value ranking may be on a scale where a score of 1.0 represents a perfect match to the ideal behavior of the functional model, while a score of 0.0 represents the upper or lower bound of the ideal behavior, or bare minimum/maximum acceptable behaviors. The component model solutions may then be sorted by their respective real value ranking.

In another example embodiments, the ranking 138 may be based on how well the respective component model solutions maximized or minimized a particular quantifiable behavior (e.g., such as power output, heat, speed, efficiency) specified by the functional model. Thus in Algorithm 3, the example function "CalculateBehavioralScore" may be configured to determine a set of ranking scores, in which the component models are ranked as an ordered set based on the magnitude of the quantifiable behavior that is to be minimized or maximized.

For example, if the desired behavior of the functional model is to maximize power output of an engine, then a hypothetical collection of five pruned component model solutions may be ranked with a score of 1 to 5 based on their resulting power outputs from their simulated executions (with 1 corresponding to highest power output). Also it should be appreciated that components may be ranked based on several different types of desired behaviors (e.g., maximizing power and minimizing fuel consumption). Thus the final ordered ranking of the component model solutions may be based on composite scores of individual rankings for each behavior.

Figure 4:
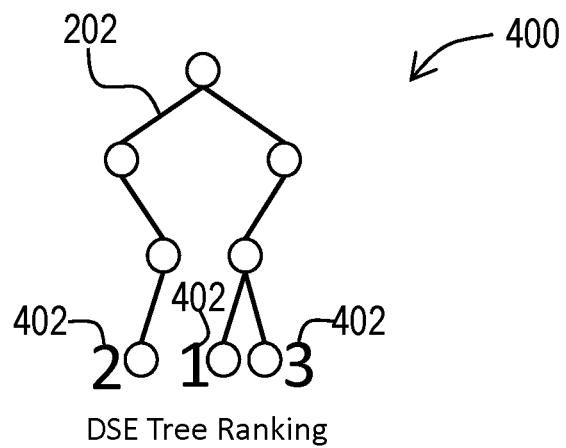
FIG. 4 illustrates an example of a design space expansion tree structure after pruning with ranked component model solutions.

FIG. 4 illustrates a schematic example of a design space ranking 400 depicting the tree structure 202 after pruning from Algorithm 2 in which branches (i.e., component model solutions) have been ranked relative to each other via the depicted ranking scores 402). In this example, a lower ranking (such as the ranking score of 1) corresponds to component model solution that more closely approximates the behavior of the functional model than other component model solutions with higher numerical scores. However, in alternative embodiments, other types of scores and orders for ranking may be used to illustrate rankings for component model solutions.

The example algorithms combine structural-based design space expansion with behavior-based branch pruning and node ranking. The design space expansion module 122 carries out Algorithm 1 in order to build up the design space, which is unknown upfront. The resulting collection of component model solutions 116 may have the property that they adhere to the same interface, which enables them to be syntactically used in the same context. However, in order to choose the best or better solutions among the collection, the design space pruning module 124 carries out Algorithm 2 in order to consider the behavior of the component model solutions compared to the functional model so that appropriate sets of simulated components are chosen that contribute to the expected behavior of the overall system. The design space ranking module 126 then carries out Algorithm 3 in order to assign rankings (e.g., numerical scores) to the design space expansion tree nodes, so as compare and rank the overall behaviors of component model solutions, which may be based on different time domains and modeling paradigms.

In order to enable a user to operate the described application software component 104, the described processing system 100 may include at least one display device 118 (such as a display screen) and at least one input device 120. For example, the processor may be included as part of a PC, notebook computer, workstation, server, tablet, mobile phone, or any other type of computing system. The display device, for example, may include an LCD display, monitor, and/or a projector. The input devices, for example, may include a mouse, pointer, touch screen, touch pad, drawing tablet, track ball, buttons, keypad, keyboard, game controller, camera, motion sensing device that captures motion gestures, or any other type of input device capable of providing the inputs described herein. Also for devices such as a tablet, the processor 102 may be integrated into a housing that includes a touch screen that serves as both an input and display device. Further, it should be appreciated that some input devices (such as a game controller) may include a plurality of different types of input devices (analog stick, d-pad, and buttons).

Also, it should be noted that the processor described herein may be located in a server that is remote from the display and input devices described herein. In such an example, the described display device and input device may be included in a client device that communicates with the server (and/or a virtual machine executing on the server) through a wired or wireless network (which may include the Internet). In some embodiments, such a client device, for example, may execute a remote desktop application or may correspond to a portal device that carries out a remote desktop protocol with the server in order to send inputs from an input device to the server and receive visual information from the server to display through a display device. Examples of such remote desktop protocols include Teradici's PCoIP, Microsoft's RDP, and the RFB protocol. In such examples, the processor described herein may correspond to a virtual processor of a virtual machine executing in a physical processor of the server.

It should be appreciated that example embodiments of the described application software component 104 may be operative to cause the display device 118 to output a graphical user interface (GUI) 140 that displays a visual representation of the data provided by the Algorithms 1-3. For example, the application software component 104 may include a visualization module 142 that generates the GUI and/or that provides information for updating the GUI so as to provide a visualization 144 of the pruned collection of component model solutions 132, and their resulting rankings 138. In addition, the visualization module 142 may provide through the GUI quantitative information regarding the determined behaviors of the solutions and/or the functional model. In addition, the visualization module may provide through the GUI, a visual representation of the component model solution having the highest ranking, which visually depicts the simulated components that comprise this component model solution. Also, the visualization module may provide through the GUI, a visual representation of the determined rankings for the component model solutions. Further, the visualization module may be responsive to inputs from the input device in order to configure and execute the described design space expansion module 122, design space pruning module 124, and design space ranking module 126.

As used herein, the highest ranking may correspond to a ranking (e.g., a score) that represents that the component model solution associated with the highest ranking has quantitative behaviors that are closer to the desired behaviors of the functional model or that maximize or minimize a specified behavior of the functional model. In example embodiments, engineers may use the higher or highest ranked component model solutions as a framework to design structural object models (e.g., 3D CAD models via CAD software) depicting a structure having an arrangement of physical components corresponding to the component model solution. The structural object models may be stored as CAD data and/or product data (specifying part data) in the data store 110 or another data store (such as in a CAD file and/or a PLM database).

The described application software component and/or other software applications may carry out various functions based on the structures stored in the CAD data and/or product data. Such functions may include generating (based on the CAD data and/or product data), engineering drawings and/or a Bill of Material (BOM) that specifies particular components (and quantities thereof) that may be used to build the structure. Such engineering drawings and/or BOM may be printed via a printer on paper, generated in an electronic form such as a Microsoft Excel file or Acrobat PDF file, displayed via a display device, communicated in an e-mail, stored in a data store, or otherwise generated in a form capable of being used by individuals and/or machines to build a product corresponding to the designed structure. Further, it should be appreciated that a machine such as a 3D printer may use data representative of the object model (before or after being modified by CAD software in view of the simulation results) to produce a physical structure (e.g., a part) from the object data.

An example of CAD software that may be used to design 3D models based on component model solutions, may include the NX suite of applications that is available from Siemens Product Lifecycle Management Software Inc. (Plano, Tex.) and/or any other software that is usable to generate CAD models. In an example embodiment, all or portions of the described application software component 104 may be included in or with such a suite of applications.

To further describe features of the described embodiments, FIG. 5, illustrates an example of an electro-mechanical structure 500 that may be simulated via the systems and methods described herein. In this example, the structure 500 corresponds to a satellite 502 with solar panels 504. Such a structure, in this example, has a behavior requirement that the solar panels 504 unfold/fold between an open position 506 and a closed position 508. The satellite design problem consists of an electro-mechanical and control problem where four pairs of solar panels (eight solar panels in total) need to unfold to capture solar energy. It should be appreciated that such solar panels are mechanical bodies connected through joints; joints are driven by electric motors; and electric motors are supplied with electrical energy from a source.

Figure 6:
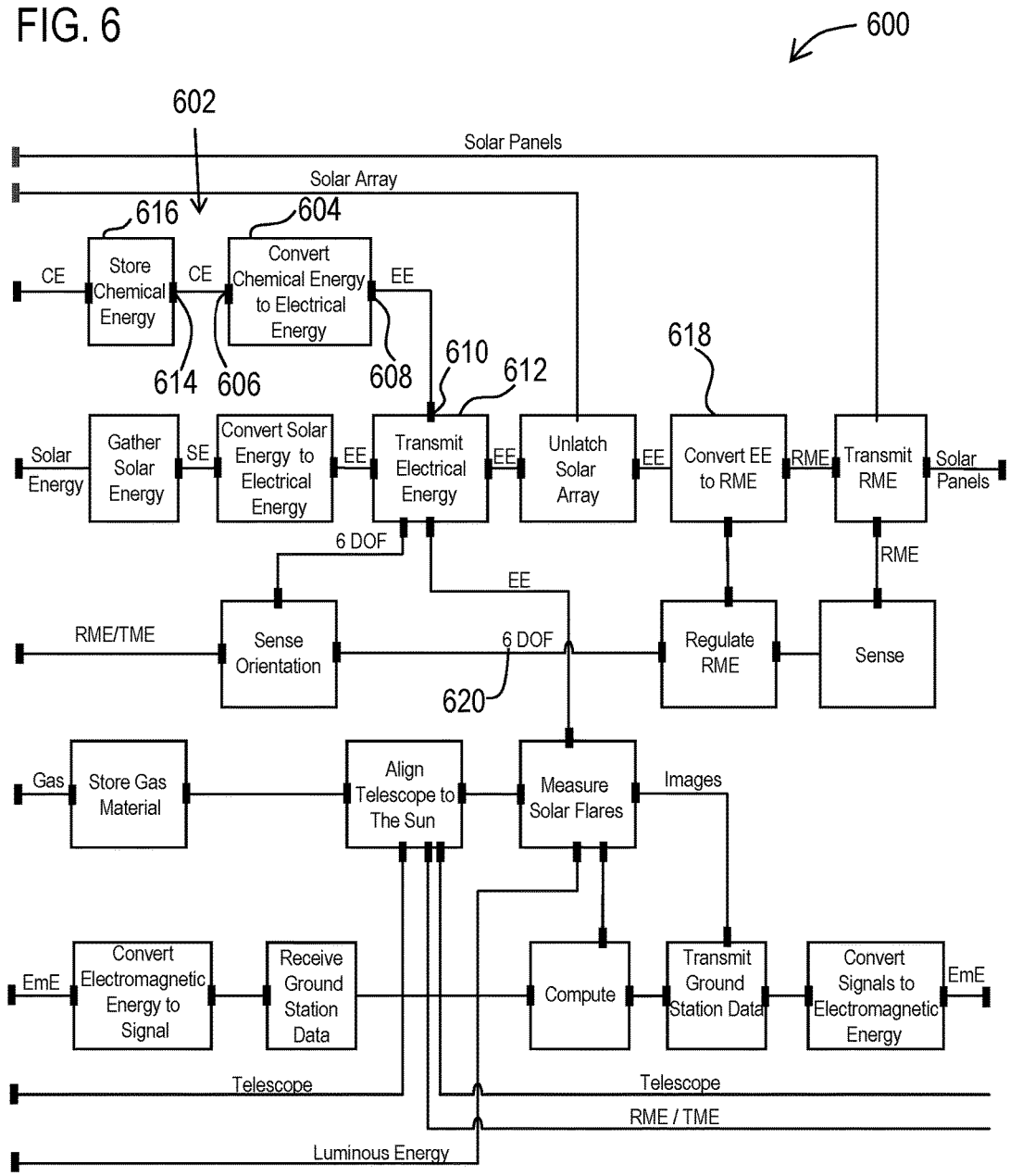
FIG. 6 illustrates an example of a functional model.

To initiate such a design, a designer/engineer may first develop a functional model corresponding to the design requirement for this (and other) aspects of the operation of the satellite 502. FIG. 6 illustrates an example of such a functional model 600 for the example satellite 502. Such a functional model, for example, may be developed with a design tool such as Microsoft Visio or other tool capable of generating a functional model.

In this example, the functional model uses a verb-noun informal function description to visually represent the model. The functional model in this example also specifies design constraints such as degrees of freedom. Also, in this example, the functional model may specify a mathematical formulation of admissible behaviors associated to each function.

As shown in FIG. 6, such a functional model 600 may be comprised of several blocks 602 that specify functions desired to be carried out. For example, block 604 specifies the function of converting chemical energy to electrical energy. For such a function, the block 604 includes an input port 606 that is of a port type that accesses chemical energy. In addition the block 604 includes an output port 608 that is of a port type that provides electrical energy. In this example, the output port 608 (that provides electrical energy) is shown connected to an input port 610 of a further block 612 specifying a function for transmitting electrical energy. Also in this example, the input port 606 (that accesses chemical energy) is shown connected to an input port 614 of a further block 616 specifying a function for storing chemical energy. Other blocks of this functional model are likewise connected together via their respective input and output ports.

As can be appreciated, such a design requirement may be carried out by a plurality of different combinations of various different types of components in one or more different domains (e.g., electrical, mechanical, hydraulic domains). An example library 700 of simulated components that may be used by systems and examples described herein to generate component model solutions for the functional model 600 is illustrated in FIG. 7. The library 700 in this example shows examples of categories of simulated components that are available in the Siemens LMS Imagine.Lab Amesim tool. However, as discussed previously, the example application software component 104 may be capable of accessing simulated components from libraries provided by other simulation software or simulated components from several different libraries and/or tools.

As discussed previously, the design space expansion module 122, is operative to generate a collection of component model solutions that are behaviorally consistent (e.g., compatible) with the behavioral functional model. To accomplish this, the described design space expansion module 122 may be configured to search through the library 700 for simulated components having input and/or output ports that are consistent with the input and output ports specified by the functional model 600.

In addition, the example design space expansion module 122 may optionally use textual descriptions (or other metadata) associated with simulated components in the library to determine behaviors of the components that assist in correlating simulated components with functionality specified in the functional design. For example, block 618 specifies a function for converting electrical energy to rotational mechanical energy (RME), the described design space expansion module 122 may search for and/or select simulated components capable of fulfilling this function based not only on the type of input and output ports of the block 618, but also based on simulated components having textual descriptions with words that are known to the design space expansion module 122 to match and/or be related to the function of rotation. For example, the word "rotary" in the textual description "rotary joint" of a simulated component in the library may be determined by the design space expansion module 122 to be related to the word "rotational" based on a look-up table of correlated functionally related words accessible to the module. Based on this determined correlation (as well as input/output port correspondence), the design space expansion module 122 may select a simulated component of a rotary joint for portions of at least one component model solution that fulfills the function to convert electrical energy to rotational mechanical energy.

Figure 8:
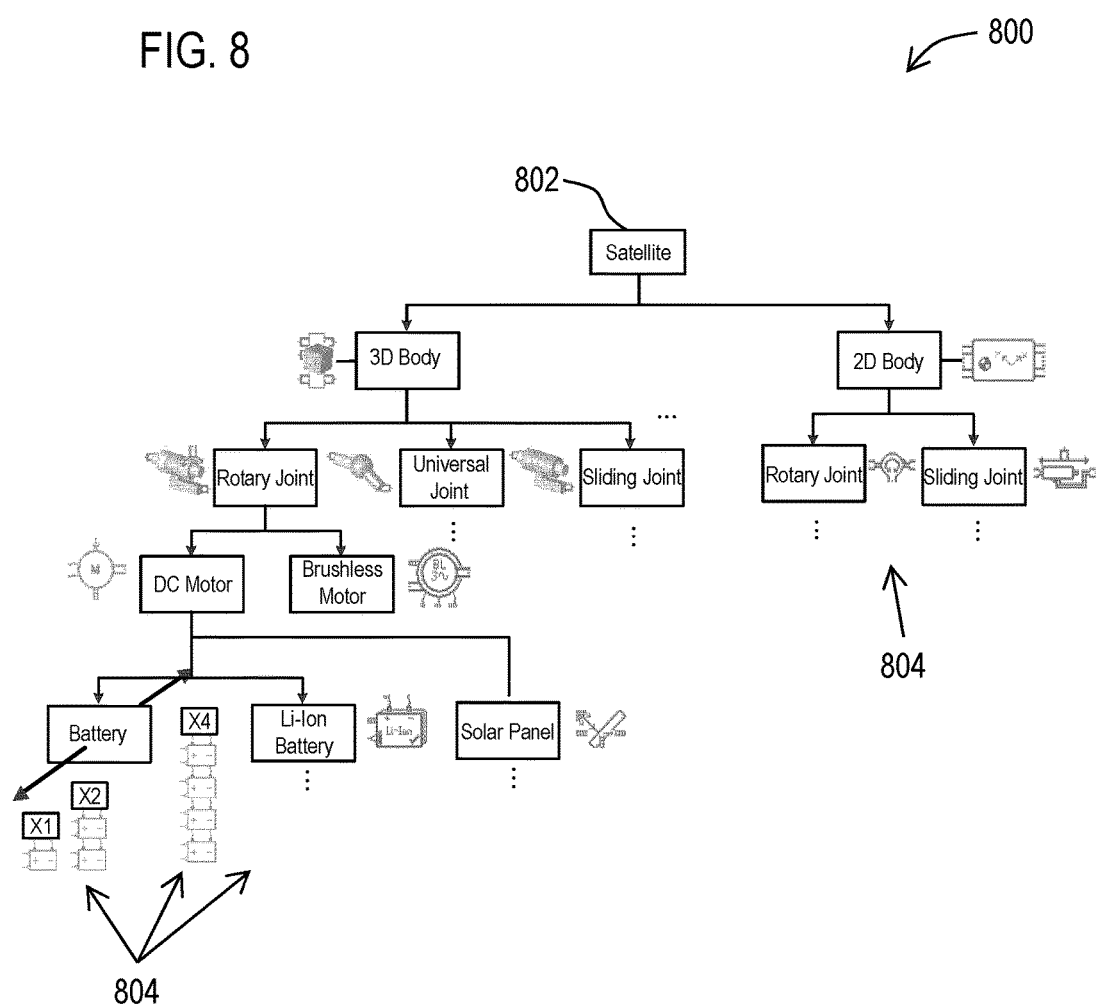
FIG. 8 illustrates a collection of component model solutions visually represented as a tree structure.

FIG. 8 illustrates an example of a partial collection 800 of component model solutions 804 organized as a tree structure 802 (such as the generic tree structure shown in FIG. 2) that may be determined by the example design space expansion module 122 based on portions of the functional model 600 shown in FIG. 6 and at least some of the simulated components included in the library 700 shown in FIG. 7. Such component model solutions 804 may be behaviorally consistent with the behavioral functional model 600.

To assist in understanding the breadth of component model solutions, the previously described visualization module 142 shown in FIG. 1, may be operative to cause the GUI 140 to display such a tree structure 802. It should be appreciated that candidate component model solutions may share some of the same components. The form of the tree structure that is generated may thus be generated by the visualization module based on an algorithm that places redundant components for two or more solutions in a common higher level branch, which forks into two or more lower branches depicting components that differ among the component model solutions.

Figure 9:
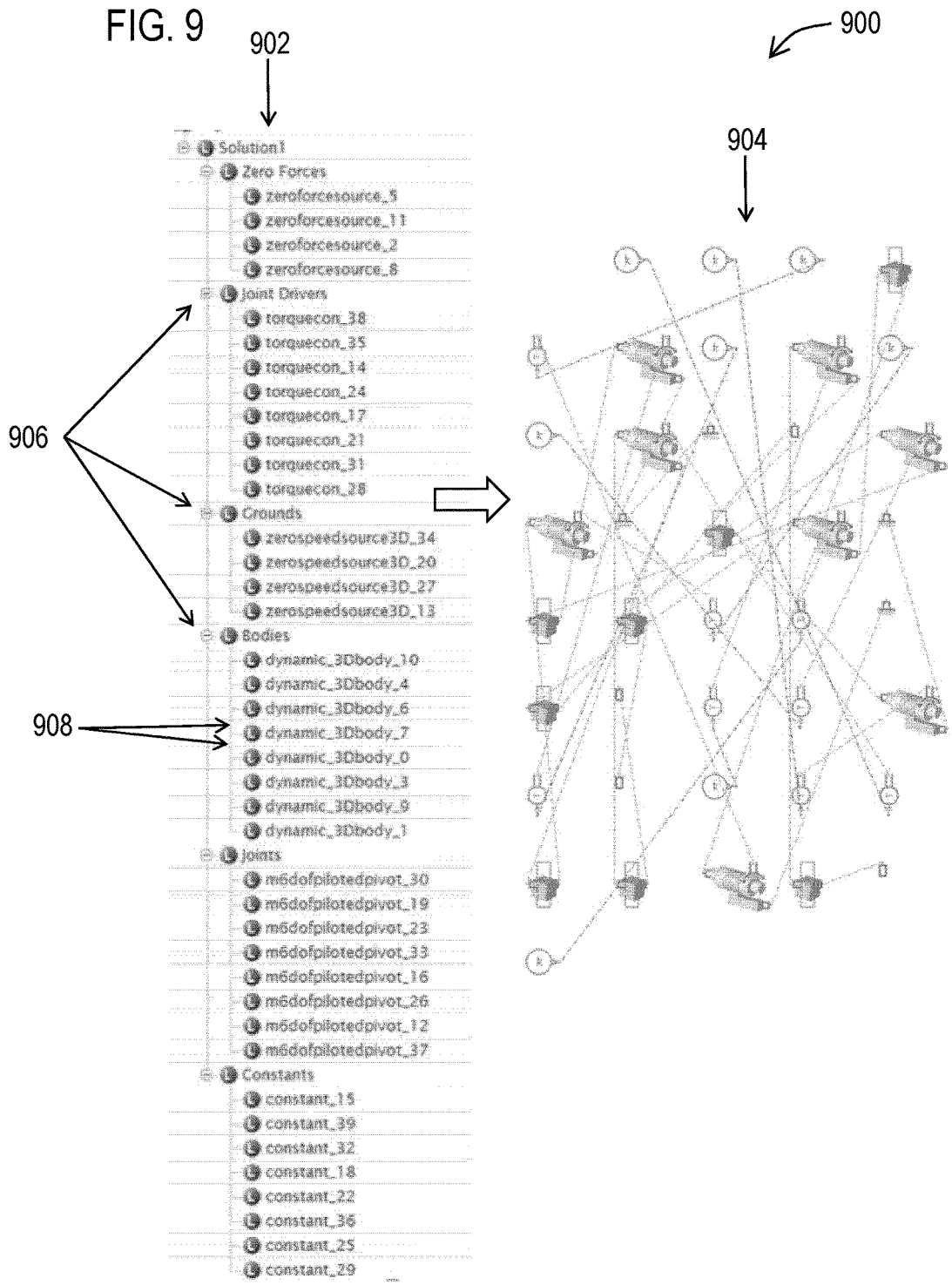
FIG. 9 illustrates an example of simulated components and associated connections for a component model solution.

FIG. 9 illustrates an example of a component model solution 900 that corresponds to one of the branches of the tree structure shown in FIG. 8. One or more visual representations of the component model solution 900 may be generated by the visualization module 142 and displayed via the GUI 140. For example, the component model solution 900 may be visually depicted as a list view 902 and/or as a connection view 904. Here, the list view lists categories (e.g., Joint Drivers, Grounds, Bodies) in the form of tree nodes 906 that contain one or more instances of simulated components 908. The connection view 904 of the component model solution specifies the manner in which the simulated components are connected to each other via their respective input/output ports.

Figure 10:
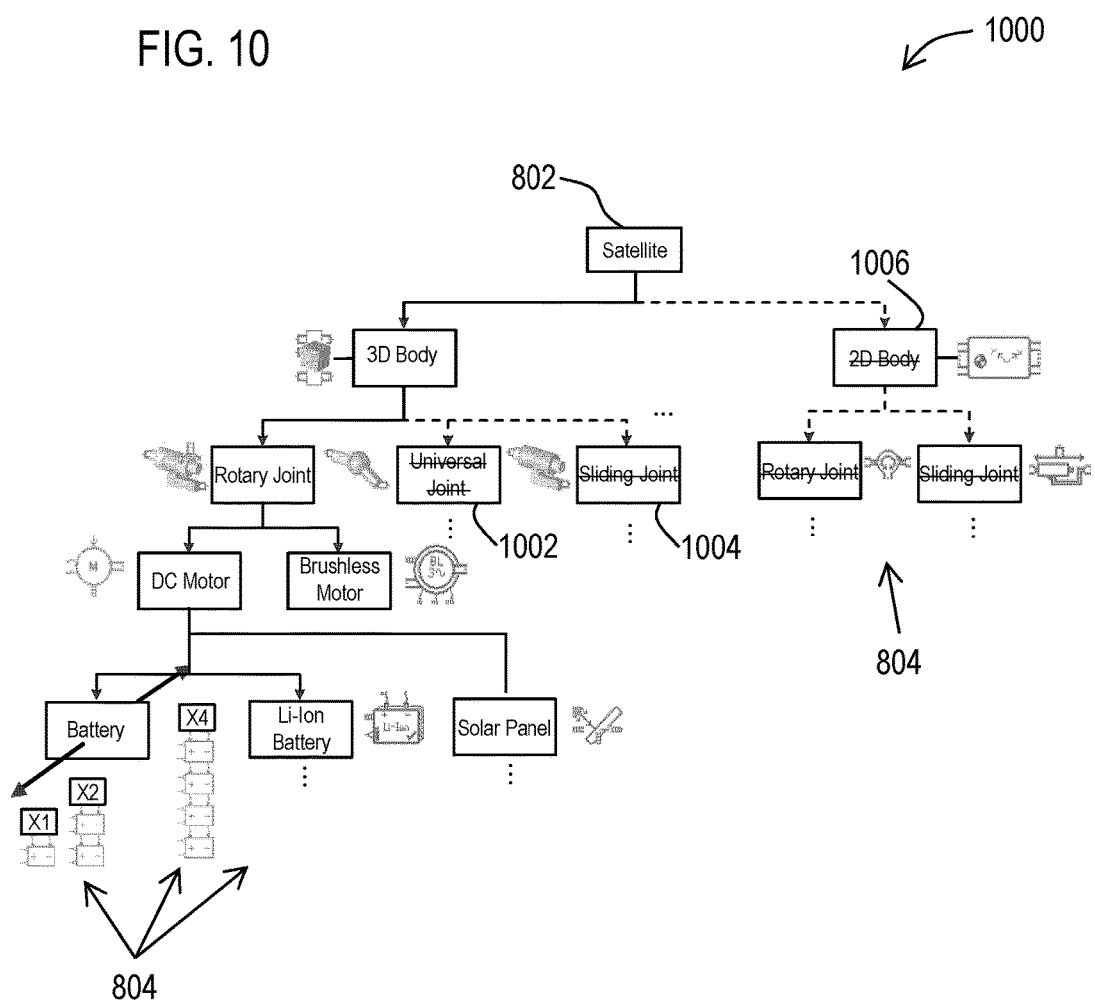
FIG. 10 illustrates a collection of component model solutions after punning.

In example embodiments, data corresponding to the generated component model solutions and the functional model are fed to the design space pruning module 124 (carrying out Algorithm 2). Using the simulated components, the Algorithm 2 verifies behavioral inclusion of the candidate solutions to the expected or desired functional behavior and prunes the branches of the tree that do not satisfy these requirements. FIG. 10 illustrates an example 1000 of the tree structure 802 (which may be visually outputted by the visualization module 142) after the previously described design space pruning module 124 has evaluated the component model solutions and has identified solutions to be pruned out.

Here the design space pruning module 124 has pruned out candidate component model solutions based on characteristics of the solutions that are inconsistent with constraints and other parameters associated with the functional model. For example, the design space pruning module 124 may be configured to determine the number of degrees of freedom that each candidate component model solution has, and prune out branches in the tree structure 802 that have a lesser determined number of degrees of freedom. In this regard, FIG. 10 shows that the universal joint branch 1002, the sliding joint branch 1004, and the 2D Body branch 1006 are eliminated from the candidate list. The functional behavior for the satellite requires three dimensions and the 2D Body family of solutions only offers two dimensions; therefore, the entire 2D Body branch 1006 is eliminated. Similarly, the unfolding function for the solar panels requires six degrees of freedom to be constrained (see constraint 620 in FIG. 6), and the Universal Joint 1002 and Sliding Joint 1004 family of solutions only provides four constrained degrees of freedom; thus, these two branches are also pruned.

After pruning, the design space ranking module 126 may rank the remaining component model solutions with respect to how closely the behavior of each solution approximates the behavior of the functional model. FIG. 11 illustrates an example 1100 of five component model solutions 1102, 1104, 1106, 1108, 1110 (after pruning) and their respective rankings 1112, 1114, 1116, 1118, 1110.

In this example, the component model solutions are ranked based on the behaviors of unfolding times and electrical energy consumption. These specific behaviors for ranking the solutions may be specified by the functional model and/or provided by a user through use of the GUI 140 of the application software component 104 via inputs to the input device 120.

Here the fifth solution 1102 has the highest ranking with respect to the behaviors of unfolding times and electrical energy consumption compared to these determined behaviors for the other four solutions. In these examples, the various solutions have different types and/or quantities of components. For example, the highest ranked solution 1102 has only two battery components, while the lowest ranked solution 1110 has eight batteries.

In this example, the particular behaviors to minimize (i.e., unfolding times, and electrical energy consumption) are specified by the functional model and/or via inputs from a user). Thus each of the underlining mathematical models for each of the component model solutions can be executed and the results analyzed to determine the respective unfolding times and electrical energy consumptions needed to rank the solutions.

However, it should be appreciated that other functional models may be designed with specific ideal mathematical formulations associated with one or more functions that define the ideal or desired behavior of the functional model. Thus in other examples, the design space ranking module (carrying out Algorithm 3) may alternatively or in addition, compare behaviors of the executed component model solutions to the behaviors of the functional model that are defined by the underlying mathematical formulations of the functional model, in order to base the rankings.

With reference now to FIG. 12, various example methodologies are illustrated and described. While the methodologies are described as being a series of acts that are performed in a sequence, it is to be understood that the methodologies may not be limited by the order of the sequence. For instance, some acts may occur in a different order than what is described herein. In addition, an act may occur concurrently with another act. Furthermore, in some instances, not all acts may be required to implement a methodology described herein.

It is important to note that while the disclosure includes a description in the context of a fully functional system and/or a series of acts, those skilled in the art will appreciate that at least portions of the mechanism of the present disclosure and/or described acts are capable of being distributed in the form of computer-executable instructions contained within non-transitory machine-usable, computer-usable, or computer-readable medium in any of a variety of forms, and that the present disclosure applies equally regardless of the particular type of instruction or data bearing medium or storage medium utilized to actually carry out the distribution. Examples of non-transitory machine usable/readable or computer usable/readable mediums include: ROMs, EPROMs, magnetic tape, floppy disks, hard disk drives, SSDs, flash memory, CDs, DVDs, and Blu-ray disks. The computer-executable instructions may include a routine, a sub-routine, programs, applications, modules, libraries, a thread of execution, and/or the like. Still further, results of acts of the methodologies may be stored in a computer-readable medium, displayed on a display device, and/or the like.

Referring now to FIG. 12, a methodology 1200 that facilitates generation of ranked component models solutions representing the functional operation of multi-domain systems is illustrated. The method may start at 1202 and the methodology may include several acts carried out through operation of at least one processor.

These acts may include an act 1204 of forming a collection of component model solutions corresponding to a functional model with functional model ports for a system to be produced. Here the component model solutions may be comprised of simulated components selected through operation of the at least one processor from at least one component library based at least in part on correspondence between component ports of the simulated components and the functional model ports of the functional model.

Also, the methodology may include an act 1206 of selecting a subset of the component model solutions from the collection, which have behaviors determined for each component model solution that are consistent with behaviors determined for the functional model. In addition, the methodology may include an act 1208 of determining a plurality of rankings for the component model solutions of the subset relative to each other based on a comparison of behaviors of each component model solution to each other and/or the behaviors determined for the functional model.

Further, this example methodology may include an act 1210 of causing a display device to output a visual representation of the component model solution having the highest ranking out of the plurality of rankings, wherein the visual representation visually depicts the simulated components that form the component model solution. At 1212 the methodology may end.

It should be appreciated that the methodology 1200 may include other acts and features discussed previously with respect to the processing system 100. For example, the methodology may include determining quantitative behaviors for each component model solution by carrying out a simulation with each component model solution in the collection. In some examples, the act 1208 of determining the plurality of rankings may be carried out through operation of the at least one processor based at least in part on a comparison of the determined quantitative behaviors of the component model solutions to each other.

Also, in some example embodiments, the methodology may include determining quantitative behaviors for the functional model and the act 1210 of determining the plurality of rankings may be carried out through operation of the at least one processor based at least in part on comparisons between the quantitative behaviors of the functional model and the quantitative behaviors of the component model solutions.

In addition an example embodiment of the methodology may include determining the quantitative behaviors for each component model solution and/or the functional model based on linear or nonlinear differential equation systems (ODEs) and/or differential-algebraic equitation systems (DAEs). Also, the act 1210 of determining the plurality of rankings may include determining numeral scores corresponding to the plurality of rankings for the component model solutions of the subset based on L2 gain and/or RMSE for the quantitative behaviors determined for each component model solution with respect to the quantitative behaviors determined for the functional model.

Example embodiments of the methodology may also include an act of determining textual functional descriptions associated with the simulated components from the at least one library of the simulated components and/or the simulated components themselves. The simulated components may further be selected for the component model solutions from the at least one component library further based on correspondence between the determined textual descriptions and functions specified by the functional model.

In addition, example embodiments of the methodology may include executing a CAD application software component and generating with the CAD application software component a CAD model of the system responsive to inputs received through operation of at least one input device. Such a CAD model may depict an arrangement of physical parts corresponding to the simulated components of the component model solution having the highest ranking. CAD data corresponding to the CAD model may then be stored in a data store.

As discussed previously, object models for structures based on a generated component model solution may be persisted as CAD data and/or product data to a CAD file and/or a PLM data store. Acts associated with generating engineering drawings and/or a BOM may then be carried out based on the CAD data or product data. Further, the methodology may include individuals manually building the structure based on the engineering drawings and/or BOM. Further such acts may include a machine (such as a 3D printer) building a structure (or a portion of the structure) based on the CAD data.

As discussed previously, acts associated with these methodologies (other than any described manual acts such as an act of manually building a structure) may be carried out by one or more processors. Such processor(s) may be included in one or more data processing systems, for example, that execute software components operative to cause these acts to be carried out by the one or more processors. In an example embodiment, such software components may comprise computer-executable instructions corresponding to a routine, a sub-routine, programs, applications, modules, libraries, a thread of execution, and/or the like. Further, it should be appreciated that software components may be written in and/or produced by software environments/languages/frameworks such as Java, JavaScript, Python, C, C#, C++ or any other software tool capable of producing components and graphical user interfaces configured to carry out the acts and features described herein.

Figure 13:
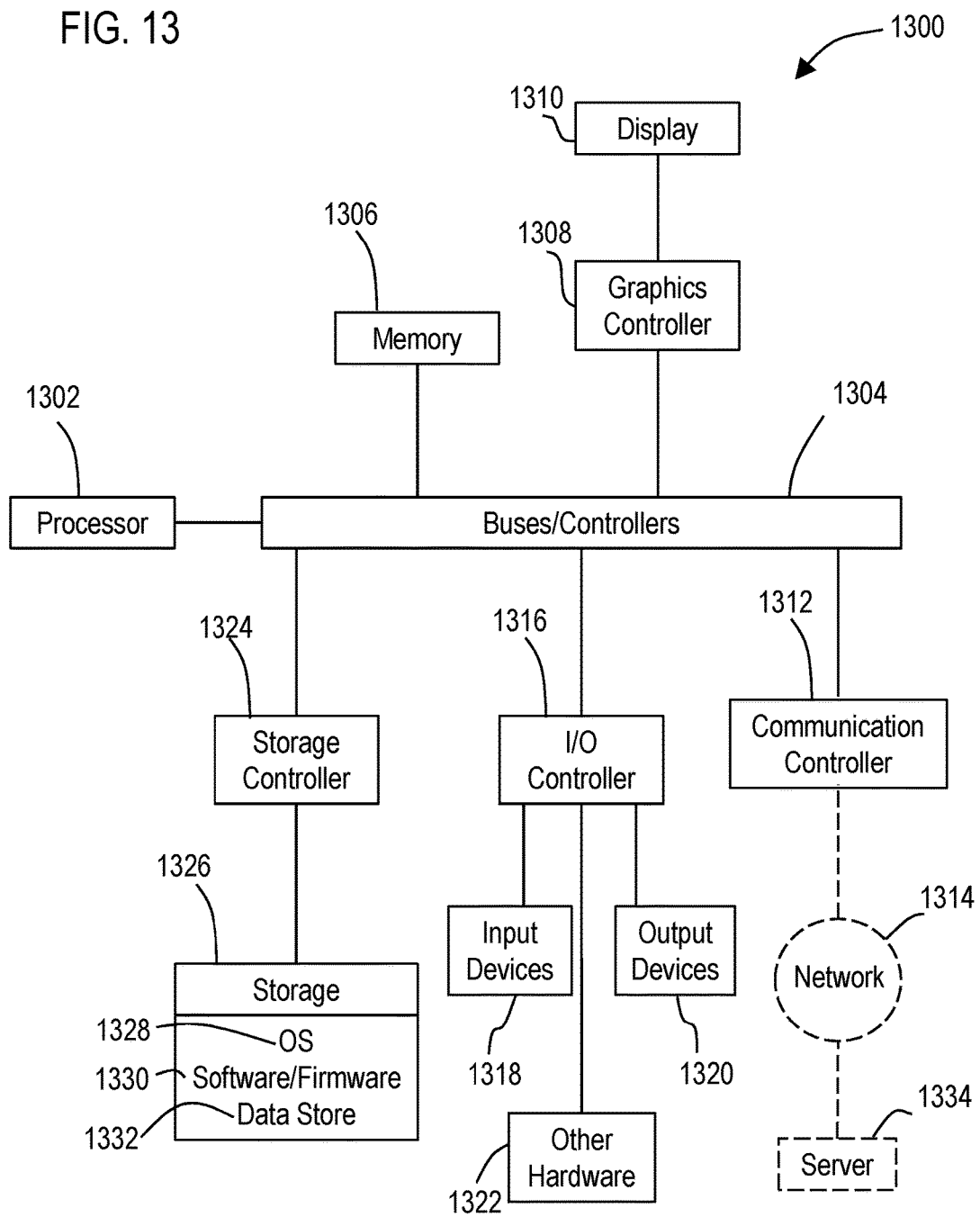
FIG. 13 illustrates a block diagram of a data processing system in which an embodiment can be implemented.

FIG. 13 illustrates a block diagram of a data processing system 1300 (also referred to as a computer system) in which an embodiment can be implemented, for example, as a portion of a multi-domain simulation and model design tool of a PLM, and/or other system operatively configured by software or otherwise to perform the processes as described herein. The data processing system depicted includes at least one processor 1302 (e.g., a CPU) that may be connected to one or more bridges/controllers/buses 1304 (e.g., a north bridge, a south bridge). One of the buses 1304, for example, may include one or more I/O buses such as a PCI Express bus. Also connected to various buses in the depicted example may include a main memory 1306 (RAM) and a graphics controller 1308. The graphics controller 1308 may be connected to one or more display devices 1310. It should also be noted that in some embodiments one or more controllers (e.g., graphics, south bridge) may be integrated with the CPU (on the same chip or die). Examples of CPU architectures include IA-32, x86-64, and ARM processor architectures.

Other peripherals connected to one or more buses may include communication controllers 1312 (Ethernet controllers, WiFi controllers, cellular controllers) operative to connect to a local area network (LAN), Wide Area Network (WAN), a cellular network, and/or other wired or wireless networks 1314 or communication equipment.

Further components connected to various busses may include one or more I/O controllers 1316 such as USB controllers, Bluetooth controllers, and/or dedicated audio controllers (connected to speakers and/or microphones). It should also be appreciated that various peripherals may be connected to the USB controller (via various USB ports) including input devices 1318 (e.g., keyboard, mouse, touch screen, trackball, gamepad, camera, microphone, scanners, motion sensing devices), output devices 1320 (e.g., printers, speakers) or any other type of device that is operative to provide inputs or receive outputs from the data processing system. Further it should be appreciated that many devices referred to as input devices or output devices may both provide inputs and receive outputs of communications with the data processing system. Further it should be appreciated that other peripheral hardware 1322 connected to the I/O controllers 1316 may include any type of device, machine, or component that is configured to communicate with a data processing system.

Additional components connected to various busses may include one or more storage controllers 1324 (e.g., SATA). A storage controller may be connected to a storage device 1326 such as one or more storage drives and/or any associated removable media, which can be any suitable non-transitory machine usable or machine readable storage medium. Examples, include nonvolatile devices, volatile devices, read only devices, writable devices, ROMs, EPROMs, magnetic tape storage, floppy disk drives, hard disk drives, solid-state drives (SSDs), flash memory, optical disk drives (CDs, DVDs, Blu-ray), and other known optical, electrical, or magnetic storage devices drives and/or computer media. Also in some examples, a storage device such as an SSD may be connected directly to an I/O bus 1304 such as a PCI Express bus.

A data processing system in accordance with an embodiment of the present disclosure may include an operating system 1328, software/firmware 1330, and data stores 1332 (that may be stored on a storage device 1326 and/or the memory 1306). Such an operating system may employ a command line interface (CLI) shell and/or a graphical user interface (GUI) shell. The GUI shell permits multiple display windows to be presented in the graphical user interface simultaneously, with each display window providing an interface to a different application or to a different instance of the same application. A cursor or pointer in the graphical user interface may be manipulated by a user through a pointing device such as a mouse or touch screen. The position of the cursor/pointer may be changed and/or an event, such as clicking a mouse button or touching a touch screen, may be generated to actuate a desired response. Examples of operating systems that may be used in a data processing system may include Microsoft Windows, Linux, UNIX, iOS, and Android operating systems. Also, examples of data stores include data files, data tables, relational database (e.g., Oracle, Microsoft SQL Server), database servers, or any other structure and/or device that is capable of storing data, which is retrievable by a processor.

The communication controllers 1312 may be connected to the network 1314 (not a part of data processing system 1300), which can be any public or private data processing system network or combination of networks, as known to those of skill in the art, including the Internet. Data processing system 1300 can communicate over the network 1314 with one or more other data processing systems such as a server 1334 (also not part of the data processing system 1300). However, an alternative data processing system may correspond to a plurality of data processing systems implemented as part of a distributed system in which processors associated with several data processing systems may be in communication by way of one or more network connections and may collectively perform tasks described as being performed by a single data processing system. Thus, it is to be understood that when referring to a data processing system, such a system may be implemented across several data processing systems organized in a distributed system in communication with each other via a network.

Further, the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely.

In addition, it should be appreciated that data processing systems may be implemented as virtual machines in a virtual machine architecture or cloud environment. For example, the processor 1302 and associated components may correspond to a virtual machine executing in a virtual machine environment of one or more servers. Examples of virtual machine architectures include VMware ESCi, Microsoft Hyper-V, Xen, and KVM.

Those of ordinary skill in the art will appreciate that the hardware depicted for the data processing system may vary for particular implementations. For example, the data processing system 1300 in this example may correspond to a computer, workstation, and/or a server. However, it should be appreciated that alternative embodiments of a data processing system may be configured with corresponding or alternative components such as in the form of a mobile phone, tablet, controller board or any other system that is operative to process data and carry out functionality and features described herein associated with the operation of a data processing system, computer, processor, and/or a controller discussed herein. The depicted example is provided for the purpose of explanation only and is not meant to imply architectural limitations with respect to the present disclosure.

As used herein, the terms "component" and "system" are intended to encompass hardware, software, or a combination of hardware and software. Thus, for example, a system or component may be a process, a process executing on a processor, or a processor. Additionally, a component or system may be localized on a single device or distributed across several devices.

Also, as used herein a processor corresponds to any electronic device that is configured via hardware circuits, software, and/or firmware to process data. For example, processors described herein may correspond to one or more (or a combination) of a microprocessor, CPU, FPGA, ASIC, or any other integrated circuit (IC) or other type of circuit that is capable of processing data in a data processing system, which may have the form of a controller board, computer, server, mobile phone, and/or any other type of electronic device.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 1300 may conform to any of the various current implementations and practices known in the art.

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, act, or function is an essential element, which must be included in the claim scope: the scope of patented subject matter is defined only by the allowed claims. Moreover, none of these claims are intended to invoke 35 USC § 112(f) unless the exact words "means for" are followed by a participle.

What is claimed is:

1. A system comprising:
 a processor; and
 a machine-readable medium storing instructions that, when executed by the processor, cause the processor to:
 access a functional model, wherein:

the function model specifies functions that a system to be produced will carry out without specifying components that will carry out the functions;

the functional model includes a plurality of functional model ports between the functions that the system to be produced will carry out; and the functional model includes behavior data that specifies functional requirements of the system to be produced; and perform a design space expansion to determine a collection of component model solutions for the functional model, wherein:

each component model solution includes a plurality of simulated components;

the design space expansion is performed by correlating ports types of the plurality of functional model ports in the functional model to component ports of the simulated components; and the collection of component model solutions includes some component model solutions that do not satisfy the functional requirements of the system to be produced;

select a subset of the component model solutions from the collection, which have behaviors determined for each component model solution that satisfy the functional requirements of the system to be produced;

determine a plurality of rankings for the component model solutions of the subset relative to each other based on a comparison of behaviors for each component model solution to each other and/or to the functional requirements included in the functional model; and cause a display device to output a visual representation of the component model solution having the highest ranking out of the plurality of rankings, wherein the visual representation visually depicts the simulated components that form the component model solution.

2. The system of claim 1, wherein the instructions to perform the design space expansion comprise instructions that, when executed, cause the processor to:

compare port types of the plurality of functional model ports in the functional model to port types of simulated components in a library of simulated components; and include a given simulated component in at least one component model solution responsive to a determination that a port type of the given simulated component adheres to at least one port type of the functional model ports.

3. The system of claim 2, wherein the instructions to perform the design space expansion comprise instructions that, when executed, cause the processor to compare the ports types of the plurality of functional model ports in the functional model to port types of simulated components in the library of simulated components as long as ports systems used in the functional model and the library of simulated components are at least partially isomorphic to each other.

4. The system of claim 1, wherein the collection of component model solutions is determined without validation as to whether each component model solution actually fulfills the functional requirements of the system to be produced.

5. The system of claim 1, wherein the machine-readable medium further stores instructions that, when executed by the processor, cause the processor to:

carry out a simulation with each component model solution in the collection to determine quantitative behaviors for each component model solution.

6. The system of claim 5, wherein the instructions to determine the plurality of rankings comprise instructions that, when executed, cause the processor to determine the plurality of rankings for the component model solutions based at least in part on a comparison of the determined quantitative behaviors of the component model solutions to each other.

7. The system of claim 5, wherein the machine-readable medium further stores instructions that, when executed by the processor, cause the processor to:

carry out a simulation with the functional model to determine quantitative behaviors for the functional model; and wherein the instructions to determine the plurality of rankings comprise instructions that, when executed, cause the processor to determine the plurality of rankings for the component model solutions based at least in part on comparisons between the quantitative behaviors of the functional model and the quantitative behaviors of the component model solutions.

8. The system of claim 5, wherein the instructions to perform the design space exploration comprise instructions that, when executed, cause the processor to:

determine textual functional descriptions associated with the simulated components from a library of simulated components or the simulated components themselves; and select simulated components for the component model solutions from the component library further based on correspondence between the determined textual descriptions and the functions specified by the functional model.

9. A method comprising:

by a computing system:

accessing a functional model, wherein:

the function model specifies functions that a system to be produced will carry out without specifying components that will carry out the functions;

the functional model includes a plurality of functional model ports between the functions that the system to be produced will carry out; and the functional model includes behavior data that specifies functional requirements of the system to be produced; and performing a design space expansion to determine a collection of component model solutions for the functional model, wherein:

each component model solution includes a plurality of simulated components;

the design space expansion is performed by correlating ports types of the plurality of functional model ports in the functional model to component ports of the simulated components; and the collection of component model solutions includes some component model solutions that do not satisfy the functional requirements of the system to be produced;

selecting a subset of the component model solutions from the collection, which have behaviors determined for each component model solution that satisfy the functional requirements of the system to be produced;

determining a plurality of rankings for the component model solutions of the subset relative to each other based on a comparison of behaviors for each component model solution to each other and/or to the functional requirements included in the functional model; and causing a display device to output a visual representation of the component model solution having the highest ranking out of the plurality of rankings, wherein the visual representation visually depicts the simulated components that form the component model solution.

10. The method of claim 9, wherein performing the design space expansion comprises:

comparing port types of the plurality of functional model ports in the functional model to port types of simulated components in a library of simulated components; and including a given simulated component in at least one component model solution responsive to a determination that a port type of the given simulated component adheres to at least one port type of the functional model ports.

11. The method of claim 10, comprising comparing the ports types of the plurality of functional model ports in the functional model to port types of simulated components in the library of simulated components as long as ports systems used in the functional model and the library of simulated components are at least partially isomorphic to each other.

12. The method of claim 9, wherein the collection of component model solutions is determined without validation as to whether each component model solution actually fulfills the functional requirements of the system to be produced.

13. The method of claim 9, further comprising carrying out a simulation with each component model solution in the collection to determine quantitative behaviors for each component model solution; and comprising determining the plurality of rankings or the component model solutions based at least in part on a comparison of the determined quantitative behaviors of the component model solutions to each other.

14. The method of claim 9, further comprising carrying out a simulation with the functional model to determine quantitative behaviors for the functional model; and comprising determining the plurality of rankings for the component model solutions based at least in part on comparisons between the quantitative behaviors of the functional model and the quantitative behaviors of the component model solutions.

15. A non-transitory machine-readable medium comprising instructions that, when executed by a processor, cause the processor to:

access a functional model, wherein:
the function model specifies functions that a system to be produced will carry out without specifying components that will carry out the functions;
the functional model includes a plurality of functional model ports between the functions that the system to be produced will carry out; and
the functional model includes behavior data that specifies functional requirements of the system to be produced; and perform a design space expansion to determine a collection of component model solutions for the functional model, wherein:
each component model solution includes a plurality of simulated components;
the design space expansion is performed by correlating ports types of the plurality of functional model ports in the functional model to component ports of the simulated components; and
the collection of component model solutions includes some component model solutions that do not satisfy the functional requirements of the system to be produced;

select a subset of the component model solutions from the collection, which have behaviors determined for each component model solution that satisfy the functional requirements of the system to be produced;

determine a plurality of rankings for the component model solutions of the subset relative to each other based on a comparison of behaviors for each component model solution to each other and/or to the functional requirements included in the functional model; and cause a display device to output a visual representation of the component model solution having the highest ranking out of the plurality of rankings, wherein the visual representation visually depicts the simulated components that form the component model solution.

16. The non-transitory machine-readable medium of claim 15, wherein the instructions to perform the design space expansion comprise instructions that, when executed, cause the processor to:

compare port types of the plurality of functional model ports in the functional model to port types of simulated components in a library of simulated components; and include a given simulated component in at least one component model solution responsive to a determination that a port type of the given simulated component adheres to at least one port type of the functional model ports.

17. The non-transitory machine-readable medium of claim 16, wherein the instructions to perform the design space expansion comprise instructions that, when executed, cause the processor to compare the ports types of the plurality of functional model ports in the functional model to port types of simulated components in the library of simulated components as long as ports systems used in the functional model and the library of simulated components are at least partially isomorphic to each other.

18. The non-transitory machine-readable medium of claim 15, wherein the collection of component model solutions is determined without validation as to whether each component model solution actually fulfills the functional requirements of the system to be produced.

19. The non-transitory machine-readable medium of claim 15, further comprising instructions that, when executed by the processor, cause the processor to:

carry out a simulation with each component model solution in the collection to determine quantitative behaviors for each component model solution; and wherein the instructions to determine the plurality of rankings comprise instructions that, when executed, cause the processor to determine the plurality of rankings for the component model solutions based at least in part on a comparison of the determined quantitative behaviors of the component model solutions to each other.

20. The non-transitory machine-readable medium of claim 15, The non-transitory machine-readable medium of claim 15, further comprising instructions that, when executed by the processor, cause the processor to:

carry out a simulation with the functional model to determine quantitative behaviors for the functional model; and wherein the instructions to determine the plurality of rankings comprise instructions that, when executed, cause the processor to determine the plurality of rankings for the component model solutions based at least in part on comparisons between the quantitative behaviors of the functional model and the quantitative behaviors of the component model solutions.

* * * * *